(12) United States Patent
Graur et al.

(10) Patent No.: US 8,108,804 B2
(45) Date of Patent: Jan. 31, 2012

(54) SHORT PATH CUSTOMIZED MASK CORRECTION (75) Inventors: Ioana Graur, Poughkeepsie, NY (US); Scott M. Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 417 days.

(21) Appl. No.: 12/355,814

(22) Filed: Jan. 19, 2009

(65) Prior Publication Data
US 2010/0185999 A1  Jul. 22, 2010

(51) Int. Cl.
G06F 17/50  (2006.01)
(52) U.S. Cl. ............... 716/52; 716/50; 430/5; 382/144
(58) Field of Classification Search ........... 716/50, 716/52; 430/5; 382/144
See application file for complete search history.

(56) References Cited

U.S. PATENT DOCUMENTS

| | | | | |
|---|---|---|---|---|
| 6,091,846 A * | 7/2000 | Lin et al. | | 382/145 |
| 6,952,818 B2 * | 10/2005 | Ikeuchi | | 430/311 |
| 6,999,611 B1 * | 2/2006 | Lopez et al. | | 382/144 |
| 7,313,774 B2 * | 12/2007 | Wright et al. | | 716/52 |
| 7,415,402 B2 * | 8/2008 | Kim et al. | | 703/13 |
| 7,503,029 B2 * | 3/2009 | Sinha et al. | | 716/51 |
| 7,530,048 B2 * | 5/2009 | Joshi | | 716/53 |
| 7,617,474 B2 * | 11/2009 | Pang et al. | | 716/139 |
| 7,756,658 B2 * | 7/2010 | Kulkarni et al. | | 702/83 |
| 7,760,347 B2 * | 7/2010 | Nehmadi et al. | | 356/237.4 |
| 7,796,801 B2 * | 9/2010 | Kitamura et al. | | 382/141 |
| 7,861,196 B2 * | 12/2010 | Huckabay et al. | | 716/136 |
| 2003/0012452 A1 * | 1/2003 | Trifonov et al. | | 382/275 |
| 2005/0189499 A1 * | 9/2005 | Lin | | 250/492.3 |
| 2006/0271906 A1 * | 11/2006 | Tang et al. | | 716/21 |
| 2007/0265725 A1 * | 11/2007 | Liu et al. | | 700/121 |
| 2008/0005704 A1 * | 1/2008 | Miloslavsky et al. | | 716/2 |

* cited by examiner

*Primary Examiner* — Naum Levin
(74) *Attorney, Agent, or Firm* — Yuanmin Cai (57) ABSTRACT Embodiments of the present invention provide a method of performing photo-mask correction. The method includes identifying a hot-spot in a photo-mask that violates one or more predefined rules; creating a window area in the photo-mask that surrounds the hot spot; categorizing the window area; selecting a solution, from a library of pre-computed solutions, based on a category of the window area; and applying the solution to the hot spot. A service-oriented architecture (SOA) system that synchronizes the design to the process is also provided.

13 Claims, 9 Drawing Sheets

SHORT PATH CUSTOMIZED MASK CORRECTION

FIELD OF THE INVENTION

The present invention relates generally to optical lithography in the field of semiconductor device manufacturing and, more specifically, relates to method and system for making photo-mask corrections with enhanced resolution to improve quality of device pattern transferring.

BACKGROUND OF THE INVENTION

Today's semiconductor device manufacturing process has pushed resolution limits of certain tools and materials used in optical lithography to a point where catastrophic failures may occur for some configurations if not being designed carefully. In order to ensure that failing configurations do not occur in actual designs, manufacturers of semiconductor devices have typically relied upon some predefined design rules that device designers must follow. However, as geometries of device patterns continue to shrink, these design rules have often been found incapable of adequately safeguarding device patterns against all failure mechanisms.

In order to protect against design failure, attempts to modify currently existing design rules have led to design rules that are overly conservative and not competitive. In the meantime, the creation of a new set of design rules that is sufficiently detailed and comprehensive to ensure manufacturability of all designs, yet being succinct and compact such that device designers may learn quickly and adhere to it, is becoming increasingly difficult. For example, the need to satisfy requirements simultaneously of both process manufacturability and product design-ability has led to a proliferation of design rules, where new rules are introduced to clarify specific geometries. However, this trend cannot continue as the amount of time required to create and introduce new design rules and the amount of knowledge required by individual designers is growing at a rate that clearly cannot be sustained.

So far, various resolution enhancement techniques (RET), such as model based optical proximity correction (MBOPC) technique, have been developed to create photo-mask shapes that are capable of capturing design intent and avoiding catastrophic errors in the process of transferring device patterns to semiconductor wafers. The process or processing step of creating such photo-mask shapes is commonly known as a mask data preparation (MDP) process or processing step. Ideally, existing design rules shall ensure that the MDP process successfully print patterns without causing catastrophic errors. However, due to the need for competitive design rules, which as a result may have pushed process margins to their extremes, the MDP process may fall short at times. Moreover, tight process margins may create patterns that are sensitive to details of the MDP process. For example, failures may occur due to mask making constraints that inhibit some best mask artifacts and cause software limitations, and may occur due to locally inserted perturbation that was intended to correct a known problem, but adversely cause similar but not identical geometrical shapes to fail. The reality may be made even more difficult by the process variations that affect preponderantly some small areas of design. Here, it shall be noted that solutions specifically crafted for these cases are often, unfortunately, less than optimum for creating a robust mask and therefore the approach of crafting solutions is generally not considered as practical.

In order to improve manufacturability of these special case geometries, attempts have been made to create model-based design-for-manufacturability (DFM) tools. These tools apply the MDP step to process input layout data first, and use the processed layout data to simulate the patterning process, typically including impact which may be caused by process variations, and create a set of contours or contour curves. The contours represent expected locations of patterns when being printed on a wafer. The contours may subsequently be used for checking regions that violate manufacturability requirements in a manner analogous to the method, known as design-rule-checking (DRC), used for checking designs for design rule violations. DFM tools are typically employed by designers to improve manufacturability of their designs by finding and highlighting areas with poor manufacturability ("hot spots"). Once hot spots are located or identified, designers may make design modifications to improve manufacturability of the layout. Usually a DFM tool uses a predefined MDP algorithm consistently across the entire layout of interest. However, neither the DFM tool nor the designers have any knowledge of how each hot spot will be impacted by subsequent changes to the used MDP algorithm. In many cases, even though local changes to the MDP algorithm may help and result in adequate manufacturability, these changes fall within the realm of the wafer manufacturer, and not the design community.

Figure 1:
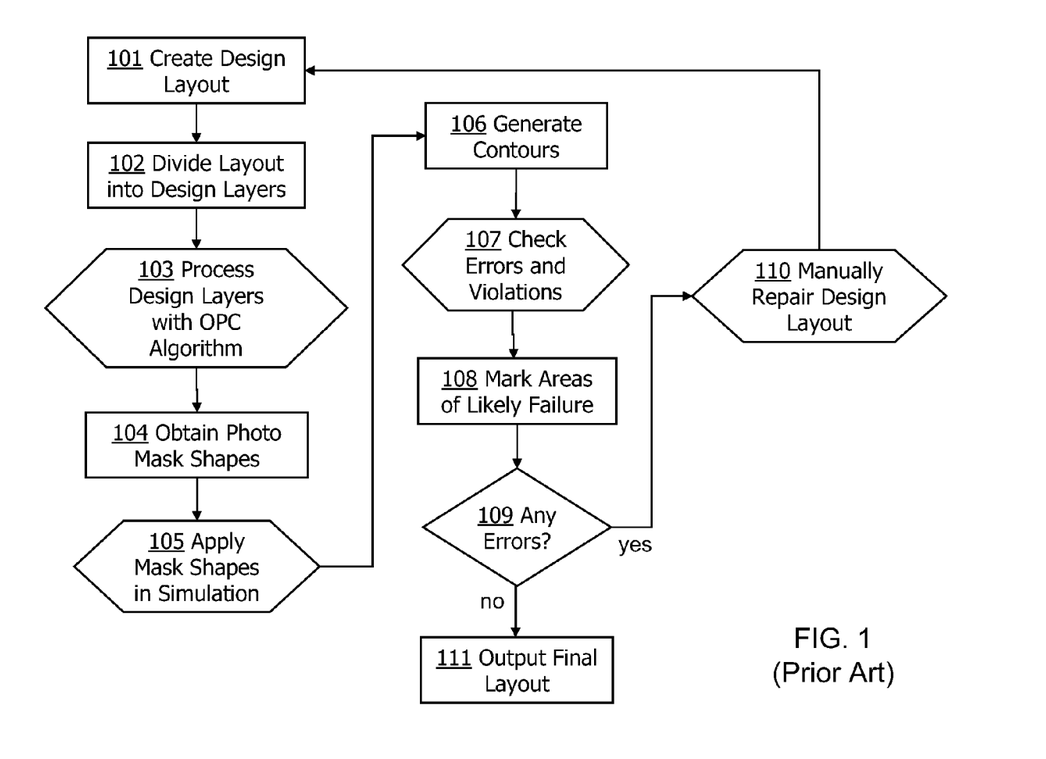
FIG. 1 is a simplified flowchart illustration that shows a process of fixing design layout to improve printability of design patterns as is known in the art.

FIG. 1 is a simplified flowchart illustration that shows a process of fixing design layout to improve printability of design patterns as is known in the art. More specifically, currently existing art tries to improve the manufacturability of design patterns by identifying hot spots through the use of a model-based DFM tool and performing manual design modifications to fix the hot spots. For example, a designer may first create a design layout (101) that represents geometries of patterns that are intended for printing on a wafer. This design layout is then divided into individual design layers (102), and processed by an OPC simulation algorithm (103) to obtain a set of photo-mask shapes (104). Here, it is understood that the step of OPC simulation algorithm (103) may include multiple steps or sub-steps of shape manipulation, which may be optionally automated, that may be carried out for various reasons including for example improving manufacturability of the device patterns. Computationally intensive optimization of source and/or mask shapes may also occur in this step, known as source-mask-optimization (SMO). Nevertheless, these shape manipulation steps and/or sub-steps are collectively referred to hereinafter as part of OPC simulation step (103) for the simplicity of description.

As is known in the art, mask shapes obtained at step 104, together with other process conditions (e.g., dose, focus, etc.), are used in a patterning simulation tool or system to simulate device patterns that may be transferred to a wafer (105). The simulation tool or system may generate a set of contours or contour curves (106) that represent the likelihood of the patterns. The contour curves are then checked at step (107) for possible violation of design rules such as space, width, enclosure, and the like. Areas or regions that are likely to cause catastrophic failures are marked (108). If there are regions or areas (109) that are candidates for causing failures, then the details of potential failures are communicated back to the designer for performing manual repair of the design layout (110). The above process is repeated until all the "hot spots" are repaired and no additional errors are found (109). Then, the final design or design layout (111) is released to the manufacturer.

It shall be noted that even though above design process, as being illustrated in FIG. 1, may contain information of mask shapes that the designer intends to print on a wafer, information such as, e.g., conditions of the MDP process used in the DFM tool may not be properly recorded and may have been lost during the process.

Creating designs that are process variation tolerant and maintaining competitive design density and electrical performance require designers applying design rules that are not extra conservative for failure avoidance. It is generally not a trivial task to strike a right balance or tradeoff between identifying a potentially failing design geometry and having a designer fix the geometry with a model-based DFM tool, and applying a post tape-out design fix approach. Attaining a proper tradeoff between the two in the shortest possible development cycle remains a major challenge in the industry.

SUMMARY OF EMBODIMENTS OF THE INVENTION

Embodiments of the present invention provide a method of performing photo-mask correction. The method includes steps of identifying a hot-spot in a photo-mask that violates one or more predefined rules; creating a window area in the photo-mask surrounding the hot spot; categorizing the window area; selecting a local solution from a library of pre-computed solutions based on the category of the window area; and applying the local solution to the hot spot.

In one embodiment, the step of categorizing the window area includes assigning a category to the window area based upon a type of violation of the hot spot being surrounded by the window area. In another embodiment, the pre-computed solutions are determined through improvement of both exposure source shapes and mask shapes.

In one embodiment, the method further include, if no solution is available from the library of pre-computed solutions based upon the category of the window area, repairing a design layout from which the photo-mask is generated.

In another embodiment, the method further includes merging the solution to a global solution, wherein the global solution is a solution applicable to the photo-mask.

According to one embodiment, the method further include steps of verifying whether all hot spots that violate one or more predefined rules have been fixed and, if not, identifying a new hot-spot in the photo-mask that violates one or more predefined rules; creating in the photo-mask a new window area surrounding the new hot spot; categorizing the new window area; selecting a new local solution from the library of pre-computed solutions, based on the category of the new window area; applying the new local solution to the new hot spot; and merging the new local solution to the global solution.

In one embodiment, the method further include, if all hot spots that violate one or more predefined rules have been fixed, producing a final design layout to a mask data preparation (MDP) tool for further processing, wherein the final design layout contains error markers.

In a further embodiment, the method includes creating a final mask shape from the final design layout, based upon pre-computed mask shapes and a mask shape generated from a general optical proximity correction (OPC) algorithm. In one embodiment, the pre-computed mask shapes are generated for design layers of the final design layout that contain error markers, and are generated by pre-computed OPC solutions.

Embodiments of the present invention provide a system for performing photo-mask correction. The system includes a server that contains one or more service applications; and one or more clients that include user specific applications communicating with the service applications situating at the server via a computer network, wherein the server, which includes a library of pre-computed optical proximity correction (OPC) solutions, merges a set of pre-computed OPC solutions selected from the library with a general OPC solution, also provided by the server, at locations determined to be in error by one or more clients, and produces a final design layout to the one of the clients.

In one embodiment, one of the one or more clients shares the library of the pre-computed OPC solutions of the server with another of the one or more clients. In another embodiment, one of the clients is a design-for-manufacturability (DFM) tool and communicates with the server in identifying a hot-spot in a photo-mask that violates one or more pre-defined rules; creating a window area in the photo-mask that surrounds the hot spot; and marking the area with an error marker.

In another embodiment, the DFM tool communicates with the server in categorizing the window area by assigning a category to the window area based upon a type of violation of the hot spot being surrounded by the window area.

In one embodiment, one of the one or more clients is a mask data preparation (MDP) tool and communicates with the server in selecting a local solution from the library of pre-computed solutions based on a category of the window area, for at least one of the locations determined to be in error.

In another embodiment, the server merges the local solution to a global solution, wherein the global solution is a solution applicable to the photo-mask.

According to yet another embodiment, a machine-readable medium having stored thereupon a set of instructions is also provided. When being executed by a machine, the set of instructions results in actions as described above. In particular, the actions include identifying a hot-spot in a photo-mask that violates one or more predefined rules; creating a window area in the photo-mask surrounding the hot spot; categorizing the window area; selecting a local solution, from a library of pre-computed solutions based on a category of the window area; and applying the local solution to the hot spot.

Embodiments of the present invention provide a method and a system for generating a set of photo-mask shapes that are capable of transferring design intent of semiconductor devices onto wafers with minimal design rule implication and impact on locally specialized artifacts that are applied globally, referred to as global solution. Embodiments of the present invention provide a way of addressing hot-spots in the design of photo-mask shapes, by applying a methodology of creating and using a library of pre-computed mask correction solutions, in the form of tagging solutions on the fly, to problem areas identified, correcting them in the best possible way known for the given problem, and integrating the solution into the final mask design. Embodiments of the present invention also provide a method of synchronizing design and simulation for optical lithography across different working entities, such as companies and/or organizations, optionally through a network, by implementing the method on a common service-oriented architecture (SOA).

BRIEF DESCRIPTION OF THE DRAWINGS

The present invention will be understood and appreciated more fully from the following detailed description of the invention, taken in conjunction with the accompanying drawings of which.

DETAILED DESCRIPTION OF EMBODIMENTS OF THE INVENTION

Figure 2:
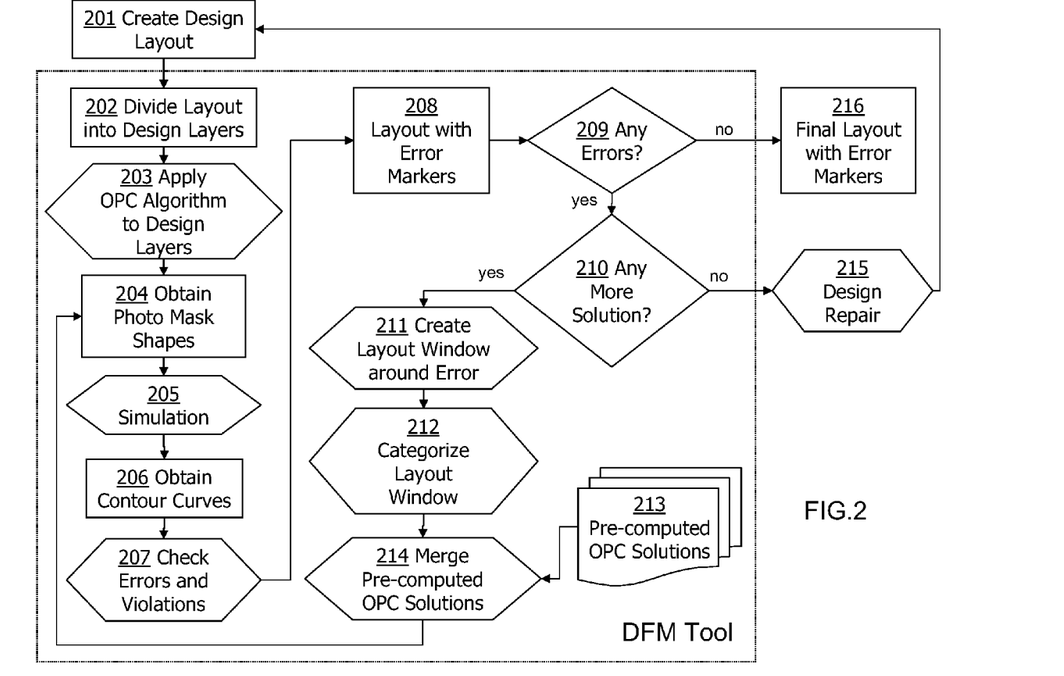
FIG. 2 is a demonstrative flowchart illustration of a method of improving printability of patterns through photo-mask correction according to one embodiment of the present invention.

FIG. 2 is a demonstrative flowchart illustration of a method of improving printability of patterns through photo-mask correction according to one embodiment of the present invention. For example, the method may include steps of verifying printability of a mask layout; applying fixes to the mask layout locally; rechecking and verifying printability of the mask layout until a satisfactory solution is found, and merging the local fixes with a global solution to achieve a complete photo-mask design.

More specifically, one embodiment of the method may start with creating a design layout (201); dividing the design layout into one or more different design layers (202); applying an OPC simulation algorithm or algorithms (203) to analyze the design layers, thereby obtaining a set of photo-mask shapes (204); and applying a simulation tool or system (205) to the set of photo-mask shapes and generating a set of contour curves (206) that represent patterns that are expected to be transferred to a semiconductor wafer. It is understood that initially the patterns may not be the same or sometimes even close to patterns that are desirable or designed for the device, which may be referred to hereinafter as "design patterns". In one embodiment, the method may subsequently proceed to check (207) whether there are any violations or errors in the patterns generated by comparing the contour curves with the design patterns, and mark areas (208) that are potentially problematic with certain markers, which are referred to hereinafter as "error markers" or "correction markers".

According to one embodiment, the method may determine whether any problematic areas or errors have been identified (209). If such problematic areas do exist (referring to FIG. 5, 501-504), the method may preferably treat these problematic areas with an iterative and prioritized correction process. For example, a set of pre-computed solutions that are designed for handling various challenging mask shapes and structures may be applied to the problematic areas locally, and the method may subsequently proceed to verify effectiveness of these correction provided by these solutions, as being described below in more details.

Specifically, according to embodiments of the present invention, the method may first verify, for example, whether there are any pre-computed solutions (210) available that may be suitable for applying to the problematic areas that are identified and marked in previous steps with error markers. If such solution or solutions exist, then a layout window or windows may be created (211) surrounding one or more of the error markers (referring to FIG. 6, 601-604). The layout windows may be categorized (212) according the types of errors they surround and a set of pre-defined criteria for categorizing errors. Categories of the windows may include, for example, isolated line-ends, nested line-ends, and H-shapes, etc. that may be based upon geometrical and image properties. Next according to one embodiment, a correction solution, for example an OPC solution may be one of which, may be selected from a library of the pre-computed solutions (213) for a particular layout window. In selecting the pre-computed solution, various techniques known in the art may be used which may include, for example, a brute-force trial and error approach and/or other elegant algorithms that are based on categorization of the layout windows. Each of the pre-computed solutions may be pre-marked with a unique identifier, for example an image or geometrical signature used to annotate recipes of the solution, which may be used for selection according to for example the category of the layout window. Once a pre-computed solution is selected for applying to the particular problematic area, "hot-spot", locally, the solution may be merged (214) with an existing global solution, which is a solution that is applied to the photo-mask layout globally.

After selecting and merging the pre-computed solution with the global solution, the mask layout may be subsequently re-simulated to verify whether all existing hot-spots or problematic areas have been corrected and no new ones are introduced as a result of locally applying the pre-computed solution. The above process may be performed through repeating steps 204-209 as described above. If one or more hot-spots or problematic areas are subsequently detected (209), one embodiment of the method may include coming back to step 210 to determine whether there are any pre-computed solutions that are suitable or applicable in fixing the newly detected or identified hot spot(s). If a suitable pre-computed solution exists, then embodiment of the method may include performing, in a similar manner as being described above, above steps of creating (211) a layout window to surround the error(s) or hot spot(s), categorizing (212) the layout window, selecting pre-computed solution (213) from the library, and merging the pre-computed solution to the existing global solution (214).

In the event that there still exist hot-spots (problematic areas or errors) but no suitable solutions after the above iterative process of selecting and merging pre-computed solutions to an existing global solution, embodiment of the method may include marking the problematic areas or hot-spots (205) for manual repair by, for example, the designer. In other words, under this circumstance, designer may need to change the design layout (201) manually. Otherwise, once all the hot-spots have been identified, assigned with pre-computed solutions (209), and corrected, the mask layout together with correction markers and identified pre-computed solutions may be released to the manufacturer (216).

Figure 3:
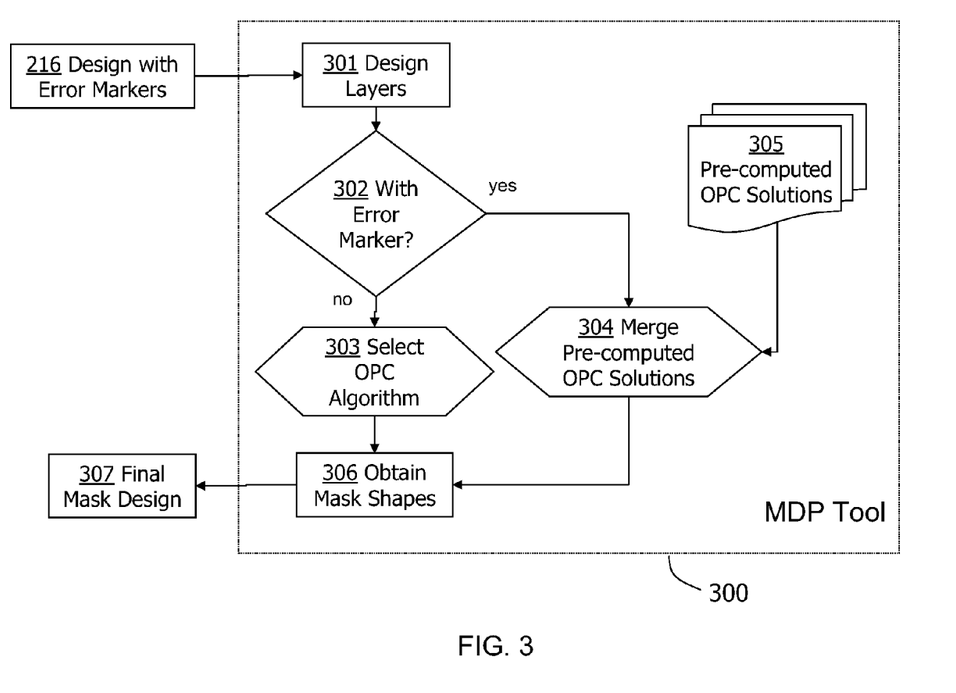
FIG. 3 is a demonstrative flowchart illustration of a method of obtaining final photo-mask design from design with correction markers according to one embodiment of the present invention.

FIG. 3 is an illustrative flowchart illustration of a method of obtaining final photo-mask design from a design layout with error markers, according to one embodiment of the present invention. For example, the method may include providing a design layout with error markers, as being described at step 216 of FIG. 2, to a mask data preparation (MDP) tool 300. The MDP tool 300 may subsequently apply both local and global OPC solutions, which may be pre-computed solutions, to the input design layout and eventually return a final photo-mask design (307). More specifically, embodiment of the method may include providing design layers (301) received from the input design layout (216), and verifying whether any design layer contains error markers or correction markers (302). If a design layer or design region does not include any correction markers, a global or general OPC simulation algorithm may be applied (303) in obtaining photo-mask shapes (306). If a design layer or design region contains correction markers, the associated and previously defined pre-computed solutions may be selected or identified (305); the pre-computed solutions may then be merged with the existing general or global OPC simulation algorithm (304); and used in simulating and obtaining photo-mask shapes (306). Photo-mask shapes produced at step 306 directly through the global OPC simulation algorithm (303) and/or through a combination of both the global and locally applied OPC simulation algorithms (303, 304) may be provided as output of a final mask design (307).

According to one embodiment of the present invention, some commonly encountered difficulties in maintaining synchronization over time of detection and correction of photo-mask shapes across multiple related working entities, such as for example different companies and/or different organizations inside one company, may be mitigated by applying a methodology as described below in more details with reference to FIG. 4.

Figure 4:
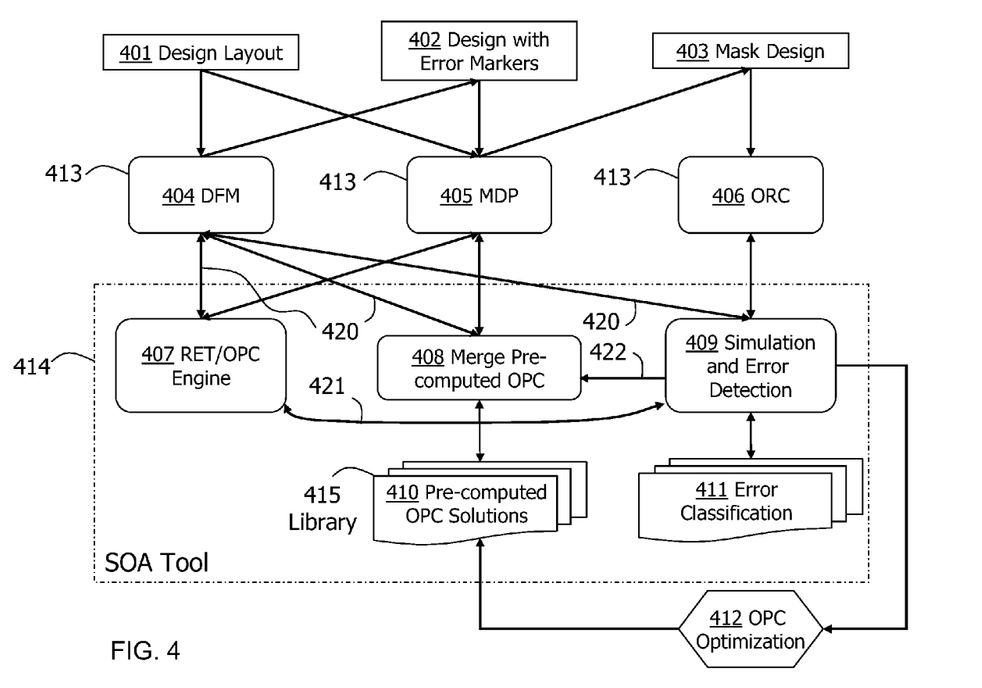
FIG. 4 is a demonstrative block-diagram illustration of a Service Oriented Architecture (SOA) system having integrated methods of performing photo-mask correction according to one embodiment of the present invention.

FIG. 4 is a demonstrative block-diagram illustration of a system, or tool, or computer network with a service-oriented architecture (SOA) according to one embodiment of the present invention. The SOA has integrated thereupon a method of performing photo-mask correction, The method may be implemented as a set of instructions stored in one or more machine-readable medium which, when executed by a machine, such as a computer or computer network system as is known in the art, may cause the SOA to perform functions as described above in FIG. 2 and FIG. 3.

More specifically, FIG. 4 illustrates a platform of software applications (e.g., 407-409) that operate as a provider of services ("server" 414) and other software applications (e.g., 404-406) that are consumers of services ("clients" 413). Further, server 414 may include, among others, an OPC engine (407), an application (408) that merges pre-computed solutions with general or global OPC solutions, and an application (409) that performs contour simulation and error detection. Server 414, or SOA tool including OPC engine 407 and applications 408 and 409, may be realized through hardware and/or software, and may include instructions installed in machine-readable medium which, when executed by a machine, performs the functions as described below.

Additionally, clients 413 may include a design-for-manufacturability (DFM) application (404) used generally by a designer to process input from design layout (401) and/or design layout with error markers (402); a mask-data-preparation (MDP) application (405) used by a semiconductor manufacturer, which takes input from design layout with/without error markers (401, 402) and produces mask design output (403); and an optical-rule-checking (ORC) application (406) which simulates post-OPC mask designs and detects errors between the simulated and desired wafer shapes. Generally, client applications (413) may communicate with server (414) and provide server (414) with various inputs such as, e.g., information on design layout. Other input information communicated from clients 413 to server 414 may include, for example, information on processing technology with which this design layout is intended to be built. On the other hand, server (414) may process these input information and return certain outputs to client (413).

For example, when working with DFM application (404), server (414) may identify and correct various hot-spots and return a design layout with correction markers as being described above in detail with reference to FIG. 2. More specifically, a design layout (401) may be initially read into DFM client (404) which may then communicate with server 414, through communication path 420, about the design layout 401. Next, RET/OPC Engine (407) may be invoked or activated to work on the design layout 401 and subsequently create a photo-mask layout. The photo-mask layout may be forwarded to a simulation and error detection module (409) through communication path 421, where errors in the photo-mask layout may be identified and classified according to some predefined error classification (411) criteria and procedures. For example, the error classification step may include creating windows around the error regions and marking those error regions with an error marker. The photo-mask layout with error markers may then be sent to module 408, via communicaton path 422, which also perform merging pre-computed OPC solutions with global OPC algorithm. Inside module 408, the error windows may be replaced by pre-computed OPC solutions (410). The DFM tool or client (404) may then provide feedback to the designer as to the manufacturability of the design layout and this design layout, together with the appropriate error markers, may be saved.

Further for example, when working with MDP application (405), server (414) may process design layouts with error markers (402) or without error markers (401) to create an improved, and in some instances optimized, final photo-mask design as being described above in detail with reference to FIG. 3. Likewise, a standalone ORC client (406) may be used to simulate and detect errors on a mask design (403). Integration of a combined MDP (405) and ORC (406) client would also be possible and many communication paths (e.g. 421-422) may actually be contained within the server to provide performance improvements.

According to one embodiment of the present invention, since multiple clients, for example client DFM and client MDP, use a common server (414) and common software platform (407-409), and the software platform (407-409) uses a common pre-computed solution library (415) and error classification procedure (409, 411) to identify and correct hot-spots, synchronizing results among different clients may be achieved. Here, it is generally understood that server (414) and clients (413) may situate on a single computer or computing apparatus, or may be distributed over a computer network via wired or wireless communication networks. Communication between client(s) and server applications may be achieved through various means known in the art (e.g. TCP/IP) and that the information exchanged may follow various formats including XML. Other direct communications methods through the use of an API could also be supported. This tool also enables an OPC adjustment and/or optimization loop (412) where OPC parameters may be adjusted and/or varied and simulation may be used to determine valid pre-computed OPC solutions. As discussed previously, here OPC is understood to include various steps and/or sub-steps of mask shape manipulation.

Figure 5:
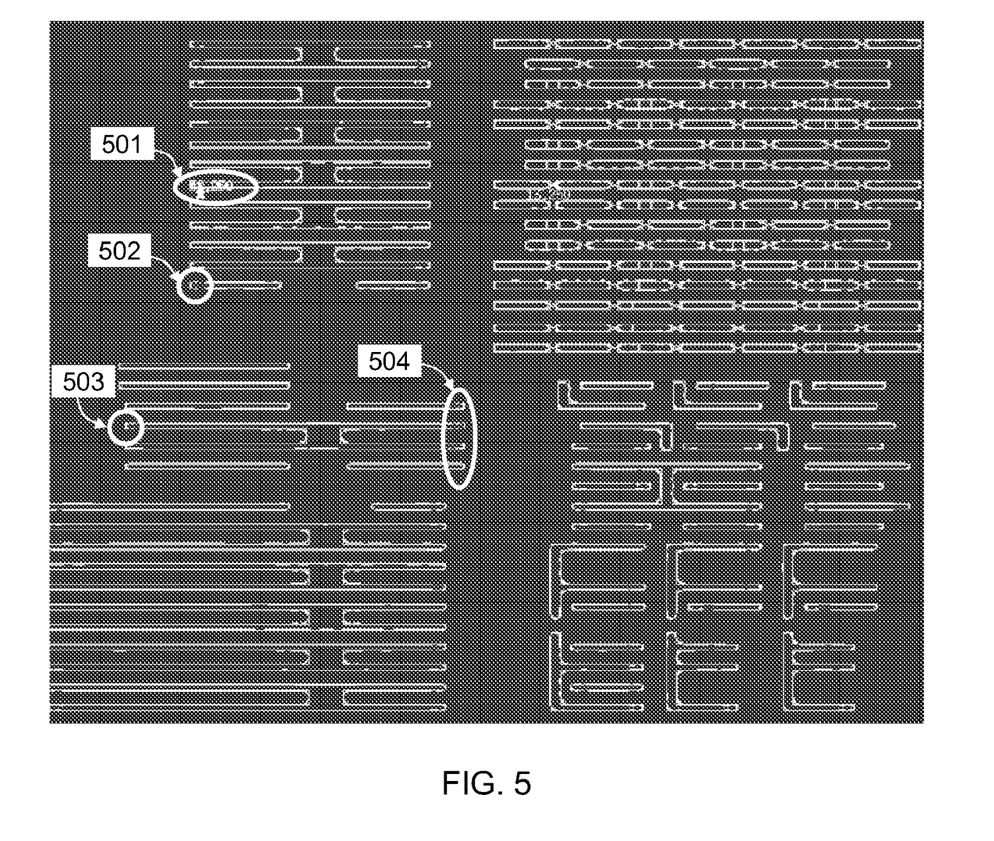
FIG. 5 is a sample SEM picture that illustrates the identification of hot-spots by applying the method according to one embodiment of the present invention.

FIG. 5 is a sample SEM picture that illustrates the identification of hot-spots (501-504) by applying a method described above according to embodiment of the present invention. More specifically, FIG. 5 illustrates several instances of design geometries that are difficult to be corrected should only the globally applied OPC solution is used without the use of local OPC solutions according to embodiment of the present invention. These instances are being highlighted in the layout by using error markers or correction markers, for example 501-504, among others, and are generally found to have poor process latitude.

Figure 6:
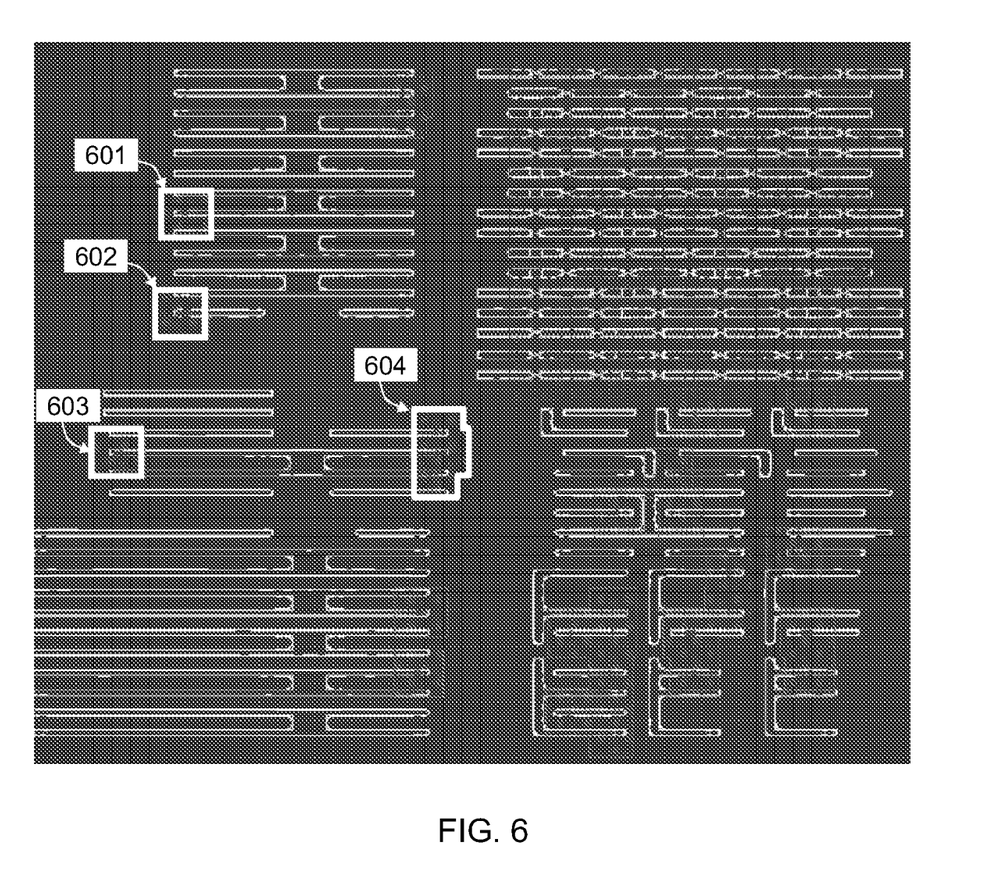
FIG. 6 is a demonstrative illustration of a method of creating layout windows surrounding hot-spots as being identified in FIG. 5.

FIG. 6 is a demonstrative illustration on how layout windows may be created to surround hot-spots identified in FIG. 5. For example, layout windows 601-604 may be created around error markers 501-504 based upon an interaction range of optical system used in the optical lithographical process. The interaction range, a distance at which other shapes influence the printability of a given shape (geometry), may range between 1-2 micrometers for example. Layout windows 601-604 may define regions for error classification and for implementation of pre-computed solutions.

Figure 7:
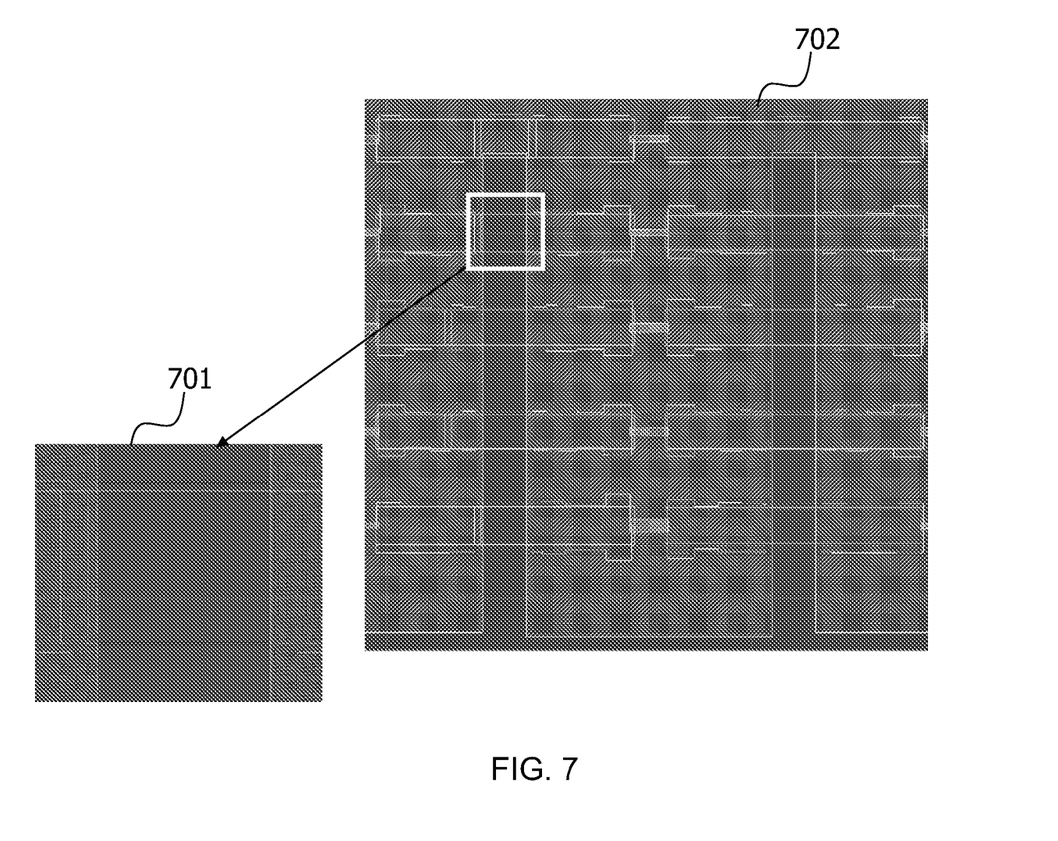
FIG. 7 is a sample SEM picture that illustrates the merging of local fix with global mask solution seamlessly.

FIG. 7 is a sample SEM picture that illustrates the merging of local fixes with a global mask solution seamlessly. For example, local fix 701 is illustrated of being seamlessly merged into the global mask solution 702, possibly through an automation system although not necessarily. FIG. 7 demonstrates the easiness of integration of local corrections with global solution. The robust treatment of the boundary regions between the global mask correction and the local custom solution offers a robust and economic solution to other alternatives, such as running a full design through a correction mechanism with built in knobs for a specific geometry. That alternative is expensive in terms of both computing resource and man power, and may suffer from the risk of including another similar but not equal geometry which would not be helped or even damages by the specific knob.

Figure 8:
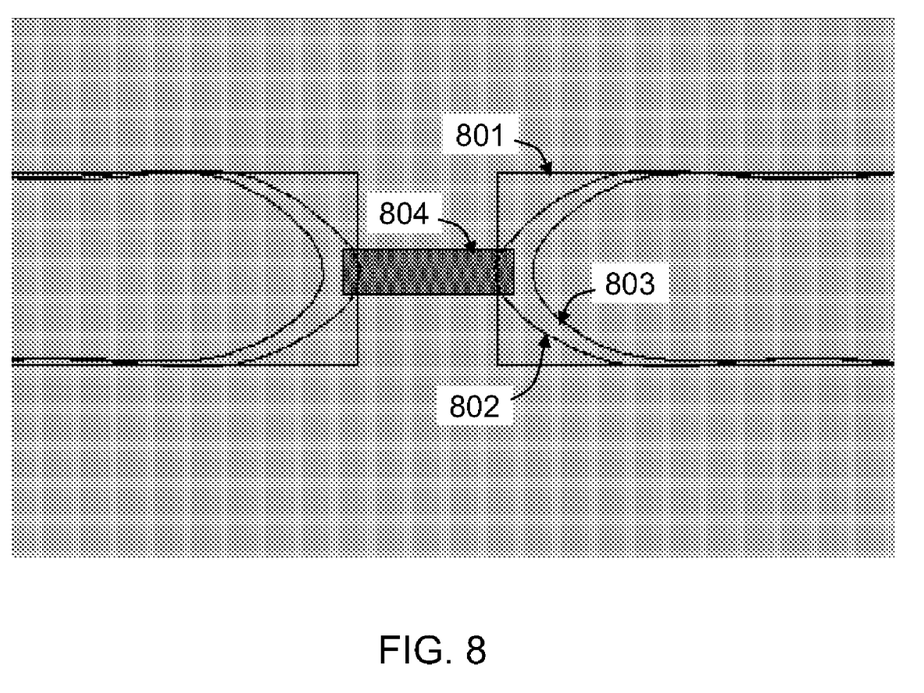
FIG. 8 is a demonstrative illustration of contours before and after applying method of local OPC solution according to one embodiment of the present invention.

FIG. 8 is a demonstrative illustration of contours before and after applying method of local OPC solutions according to one embodiment of the present invention. More specifically, FIG. 8 shows a short contour 803, which is away from a desired line-end of rectangular shape 801 that is targeted for patterning on a semiconductor wafer. The short contour 803 is a direct result from a general (global) OPC solution which apparently does not match the design intent and therefore is generally considered as a yield detractor. FIG. 8 also illustrates a contour 802 that, in comparison with short contour 803 and as a result of applying local hot-spot fixes, touches the desired line-end of rectangular shape 801 after certain pre-computed OPC solutions were applied. In FIG. 8, 804 is the original marker output by the tool for printability predictions deviating from target (it marks where a fix is needed).

Figure 9:
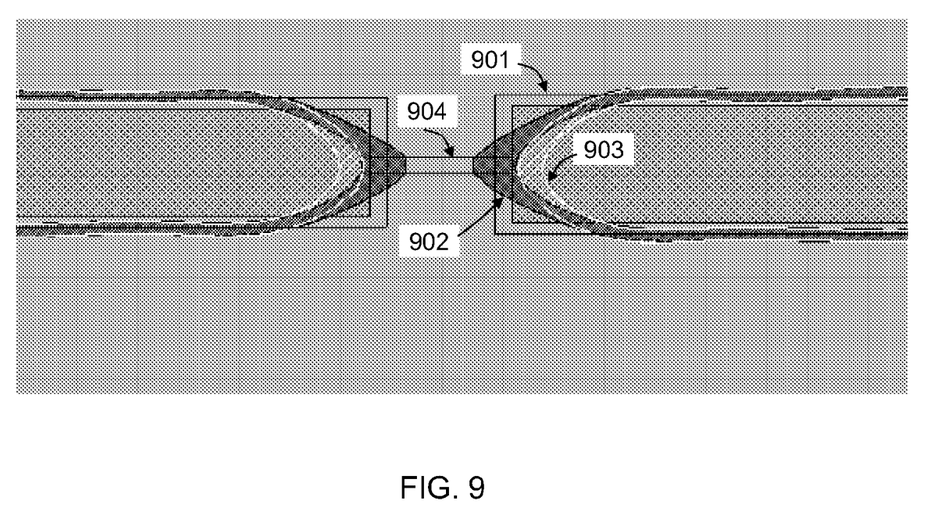
FIG. 9 is a demonstrative illustration of contours before and after applying method of local OPC solution according to another embodiment of the present invention.

FIG. 9 is a demonstrative illustration of contours before and after applying method of local OPC solutions according to another embodiment of the present invention. More specifically, FIG. 9 shows long contours 902 (solid) away from the desired line-end of rectangular shapes 901 that are targeted for patterning on a semiconductor wafer. Similar to FIG. 8, this is directly resulted from a general or global OPC solution without applying local OPC solutions or local fixes to hot-spots. FIG. 9 shows a potential risk of bridging, caused by long contours 902, the two rectangular shapes 901 which have a gap 904. On the other hand, short contours 903 (hashed) touch the line-end of rectangular shapes 901. Short contours 903 are generated after local OPC solutions were applied to fix hot-spots according to embodiment of the present invention.

Both FIG. 8 and FIG. 9 clearly demonstrate that a more robust photo-mask or photo-mask layout may be obtained and/or constructed by applying small perturbation principle, such as applying local, instead of global, OPC solutions to problematic areas or hot spots in a design layout, and merging these local OPC solutions to the global OPC solution in obtaining a final photo-mask design, illustrating the effectiveness of embodiments of method of the present invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of performing photo-mask correction, comprising using a computer in:
   identifying a hot-spot in a photo-mask that violates one or more predefined rules;
   creating a window area in said photo-mask surrounding said hot spot;
   categorizing said window area;
   selecting a local solution, from a library of pre-computed solutions, based upon said category of said window area; and
   applying said local solution to said hot spot.

2. The method of claim 1, wherein categorizing said window area comprises assigning a category to said window area based upon a type of violation of said hot spot being surrounded by said window area.

3. The method of claim 1, further comprising using a computer in repairing a design layout from which said photo-mask is generated, if based upon said category of said window area no local solution is available from said library of pre-computed solutions.

4. The method of claim 1, further comprising using a computer in merging said local solution to a global solution, wherein said global solution being a solution applicable to said photo-mask.

5. The method of claim 1, wherein said pre-computed solutions are determined through improvement of both exposure source shapes and mask shapes.

6. The method of claim 4, further comprising using a computer in verifying whether all hot spots that violate one or more predefined rules have been fixed and, if not,
   identifying a new hot-spot in said photo-mask that violates one or more predefined rules;
   creating in said photo-mask a new window area surrounding said new hot spot;
   categorizing said new window area;
   selecting a new local solution from said library of pre-computed solutions, based on said category of said new window area;
   applying said new local solution to said new hot spot; and
   merging said new local solution to said global solution.

7. The method of claim 4, further comprising, if all hot spots that violate one or more predefined rules have been fixed, using a computer in producing a final design layout to a mask data preparation (MDP) tool for further processing, wherein said final design layout containing error markers.

8. The method of claim 7, further comprising using a computer in creating a final mask shape from said final design layout based upon pre-computed mask shapes and a mask shape generated from a general optical proximity correction (OPC) algorithm.

9. The method of claim 8, wherein said pre-computed mask shapes are generated for design layers of said final design layout containing error markers, and are generated by pre-computed OPC solutions.

10. A machine-readable non-transitory storage medium having stored thereupon a set of instructions that, when being executed by a machine, results in:

identifying a hot-spot in a photo-mask that violates one or more predefined rules;
creating a window area in said photo-mask surrounding said hot spot;
categorizing said window area;
selecting a local solution, from a library of pre-computed solutions based on a category of said window area; and
applying said local solution to said hot spot.

11. The machine-readable non-transitory storage medium of claim 10, wherein categorizing said window area comprises assigning a category to said window area based upon a type of violation of said hot spot surrounded by said window area.

12. The machine-readable non-transitory storage medium of claim 10, when said set of instructions being executed by said machine, further results in repairing a design layout from which said photo-mask is generated, if based upon said category of said window area no local solution is available from said library of pre-computed solutions.

13. The machine-readable non-transitory storage medium of claim 10, when said set of instructions being executed by said machine, further results in merging said local solution to a global solution, wherein said global solution being a solution applicable to said photo-mask.

* * * * *